United States Patent [19]
Imaizumi

[11] Patent Number: 4,580,248
[45] Date of Patent: Apr. 1, 1986

[54] ELECTRONIC APPARATUS WITH MEMORY BACKUP SYSTEM

[75] Inventor: Mamoru Imaizumi, Nagoya, Japan

[73] Assignee: Brother Kogyo Kabushiki Kaisha, Nagoya, Japan

[21] Appl. No.: 489,364

[22] Filed: Apr. 28, 1983

[30] Foreign Application Priority Data

May 7, 1982 [JP] Japan ............................ 57-67171[U]

[51] Int. Cl.$^4$ ............................................. G11C 29/00
[52] U.S. Cl. ..................................... 365/229; 365/195
[58] Field of Search ............... 365/229, 228, 226, 201, 365/195; 307/66

[56] References Cited

U.S. PATENT DOCUMENTS

| | | | |
|---|---|---|---|
| 3,859,638 | 1/1975 | Hume, Jr. | 365/229 |
| 4,232,377 | 11/1980 | Tallman | 365/229 |
| 4,451,742 | 5/1984 | Aswell | 365/229 |

OTHER PUBLICATIONS

Davies, "Battery Back-Up Voltage Monitor," New Electronics, vol. 13, No. 19, Sep. 30, 1980, p. 38.
Washburn, "Battery Backup for Minicomputer Semiconductor Memories", Computer Design, vol. 16, No. 4, Apr., 1977, pp. 108, 110, 112.
Bruni, "Keep Your Microcomputer Alive", Electronic Design 16, vol. 25, Aug. 2, 1977, pp. 80–81.
Mong, "Power Out Warning Interrupt Circuit", IBM Technical Disclosure Bulletin, vol. 18, No. 12, May 1976, pp. 4147–4149.

Primary Examiner—James W. Moffitt
Assistant Examiner—Glenn A. Gossage
Attorney, Agent, or Firm—Moonray Kojima

[57] ABSTRACT

An electronic apparatus comprising a memory and a memory backup power source for supplying power to the memory when normal power supply to the apparatus is interrupted; wherein after resumption of normal power supply to the apparatus, and error signal is generated when the voltage of the memory backup power source is below a predetermined value, indicating that the content of the memory is not reliable. Circuitry to inhibit recharging of the backup power source and prevent read/write operations during the voltage checking period is also included.

4 Claims, 11 Drawing Figures

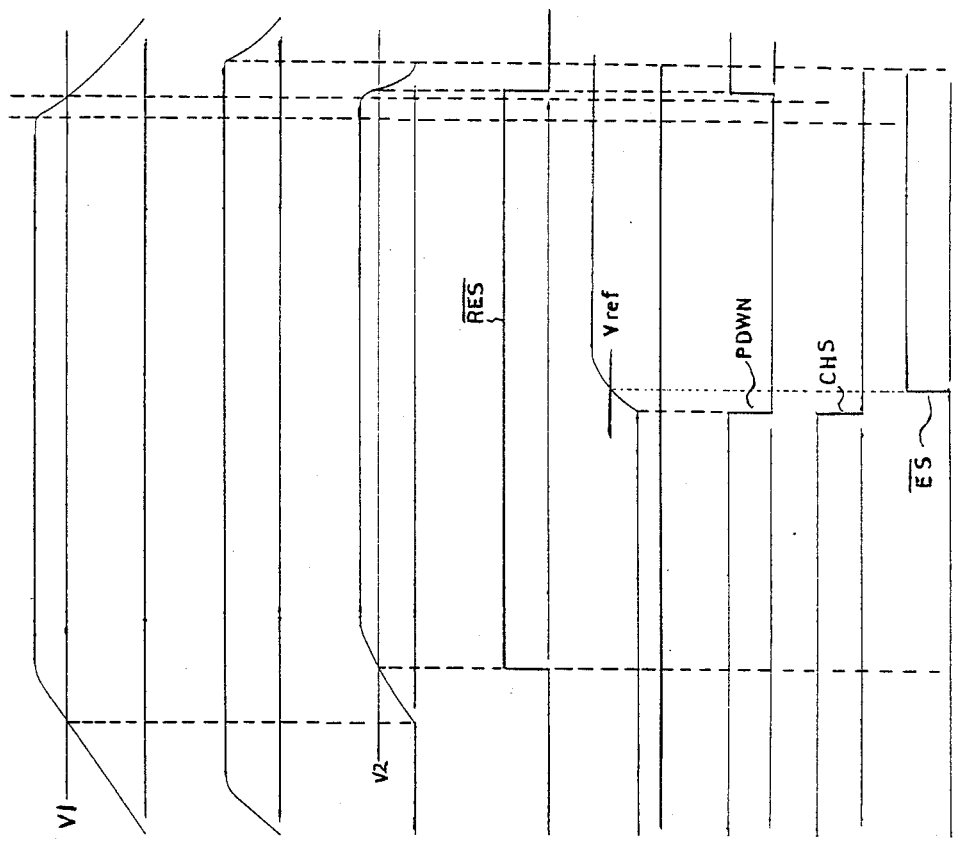

ELECTRONIC APPARATUS WITH MEMORY BACKUP SYSTEM

BACKGROUND OF THE INVENTION

1. Field of the Invention

This invention relates to an electronic apparatus which is capable of retaining stored data in a memory during interruption of power supply thereto, with the aid of a memory backup power source.

2. Discussion of the Prior Art

In conventional electronic apparatus of the foregoing type, generally, the data stored in a memory, such as a random access memory, is retained by the use of a memory backup power source when power to the apparatus is interrupted. In order to ascertain whether the content of the memory is accurately retained or not at the time power is again supplied to the apparatus, it was heretofore customary to execute this step by accessing check data written previously at a partial storage position in the memory, then, deciding, in accordance with the correctness or incorrectness of the check data thus accessed, the validity of the desired data written at other storage positions in the memory, and producing an error signal in case any error was detected from the check data. However, if the voltage of the memory backup power source was reduced to near the threshold value of a data retaining voltage, at the time of interruption of power to the apparatus, the desired data may become destroyed in the memory even though the check data was retained validly therein. Thus, disadvantageously, exact decision on the validity of the desired data is not attainable by discriminating the check data at the time of resumption of power.

Furthermore, in another conventional apparatus of a type equipped with additional circuitry for checking the data retaining voltage of a memory backup power source during interruption of the power supply, there also exist various disadvantages, such as higher production costs due to use of such additional circuitry, increased power consumption in the memory backup power source, and shortening of the total backup time for the memory.

Accordingly, there is still certain deficiencies which need correcting in backup power sources used for memory upon interruption of power supply to the apparatus using such memories.

SUMMARY OF THE INVENTION

Accordingly, an object of the invention is to provide an electronic apparatus capable of exactly deciding, during interruption of power supply thereto, validity of data retained in a memory with the aid of a memory backup power source.

Another object resides in providing an electronic apparatus adapted to ascertain the validity of the memory by checking the voltage of a memory backup power source prior to charging the memory backup power source, when power supply to the apparatus is resumed.

A further object is to provide an electronic apparatus wherein data writing and data reading are prohibited with regard to the memory, in case the voltage of a backup memory power source is below a predetermined value at the time power is again supplied.

A preferred embodiment of the present invention comprises a memory for storing data therein, a memory backup power source for furnishing electric power to the memory when power supply to the electronic apparatus is interrupted, a circuit for charging the memory backup power source after resumption of the power supply to the apparatus, voltage checking circuit for generating an error signal when the voltage of the memory backup power source is below a predetermined value, and control circuit for temporarily preventing the action of the charging circuit to the memory backup power source upon resumption of the power to the apparatus, and thereby render the action of the voltage checking circuit effectual.

BRIEF DESCRIPTION OF THE DRAWINGS

FIG. 4(A) through FIG. 4(H) depict voltage waveforms of signals effecting operation of the invention.

DETAILED DESCRIPTION OF PREFERRED EMBODIMENTS

The preferred embodiment herein disclosed is used with a memory backup power source, memories, and associated circuits, and may be employed whereever such memories are used. Other circuit elements and components are not shown for convenience of description and for simplification of description.

Figure 1:
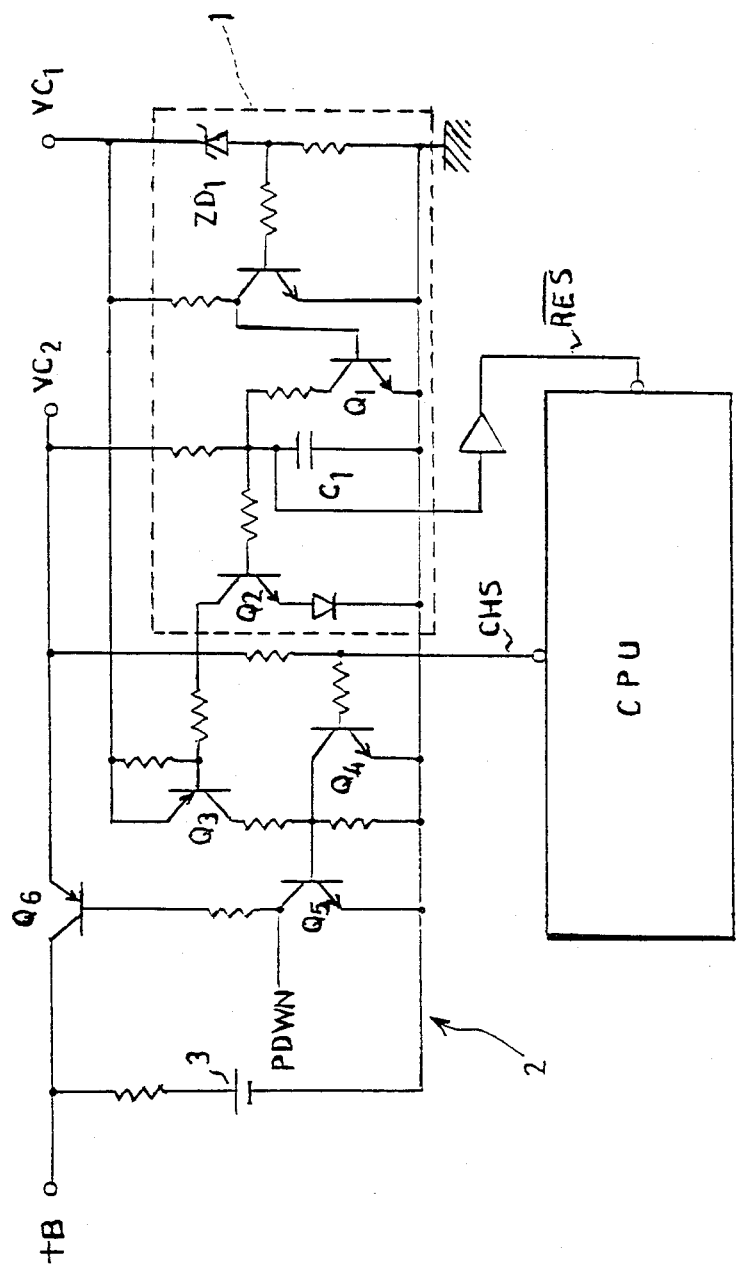
FIG. 1 is an electric circuit diagram depicting a charging circuit used in this invention.

Referring now to FIG. 1 and FIGS. 4(A)–4(H), in a reset ircuit 1, immediately after resumption of power supply to an electronic apparatus wherein one or more memories are used, such as in this invention, if the voltage of a first control power source VC1 having a waveform of FIG. 4(A) is lower than a predetermined voltage V1 set by a Zener diode ZD1, a reset signal $\overline{RES}$ (see FIG. 4(D) and FIG. 1) is inverted to a low level in response to conduction of a transistor Q1, thereby disabling a central processing unit CPU. Subsequently, when the voltage of first control power source VC1 increases above predetermined voltage V1, transistor Q1 is turned "off" so that the voltage of a second control power source VC2, having a waveform of FIG. 4(B), is applied to a capacitor C1. At the moment the charge voltage of capacitor C1, having a waveform of FIG. 4(C), reaches another predetermined voltage V2, reset signal $\overline{RES}$ is inverted to a high level, thereby enabling central processing unit CPU, while turning "on" transistor Q2 and Q3.

In charging circuit 2 (FIG. 1), transistors Q5 and Q6 are turned "off" when a transistor Q4 is turned "on" in response to a charge signal CHS (FIG. 4(G) and FIG. 1) of a high level fed from central processing unit CPU after power is supplied to the apparatus. As a result, second control power source VC2 is prevented from charging a memory backup power source 3, comprising, for example, a chargeable nickel-cadmium battery or the like, and simultaneously a power supply signal PDWN (FIG. 4(F) and FIG. 1) is inverted to a high level. The terminal voltage of memory backup power source 3 has a waveform of FIG. 4(E). From FIGS. 4(F) and 4(G), it is clear that the CPU has the function of setting a significant period and acts as a timing means.

When charge signal CHS fed from central processing unit CPU is inverted to a low level to turn "off" transistor Q4, transistors Q5 and Q6 are turned "on" so that memory backup power source 3 is charged by second control power source VC2.

Figure 2:
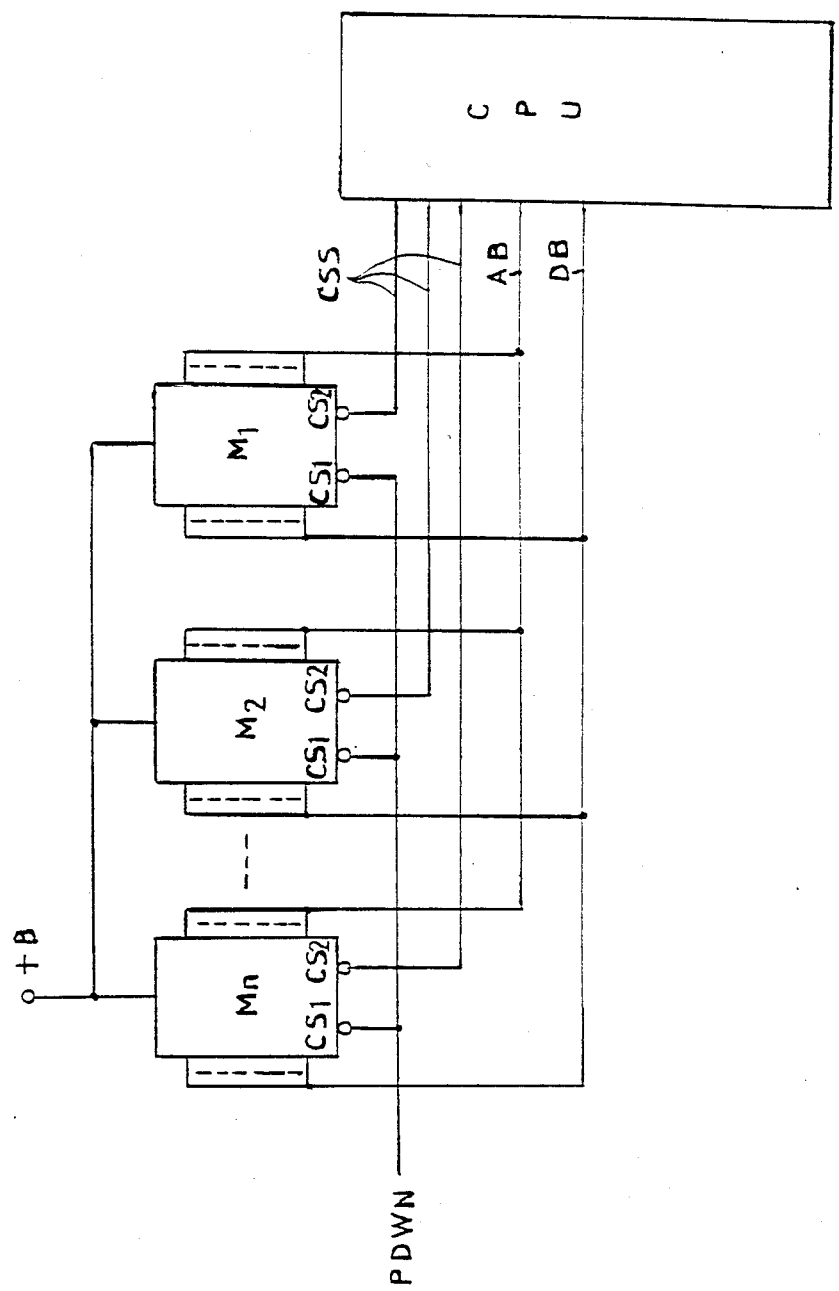
FIG. 2 is a block circuit diagram depicting a memory used in this invention.

Memories M1 . . . Mn, shown in FIG. 2, are, for example, random access memories composed of, for example, semiconductor elements and adapted for writing data and reading data. Memory backup power source 3 is connected (See +B in FIG. 2) in common to memories M1 . . . Mn. An address bus AB and a data bus DB from central processing unit CPU are connected to memories M1 . . . Mn. A chip selection signal CSS from central processing unit CPU is fed to each of terminals CS2, while power supply signal PDWN is fed in common to terminals CS1. If power supply signal PDWN is at a high level, data reading and data writing are prevented from occuring with regard to memories M1 . . . Mn.

Figure 3:
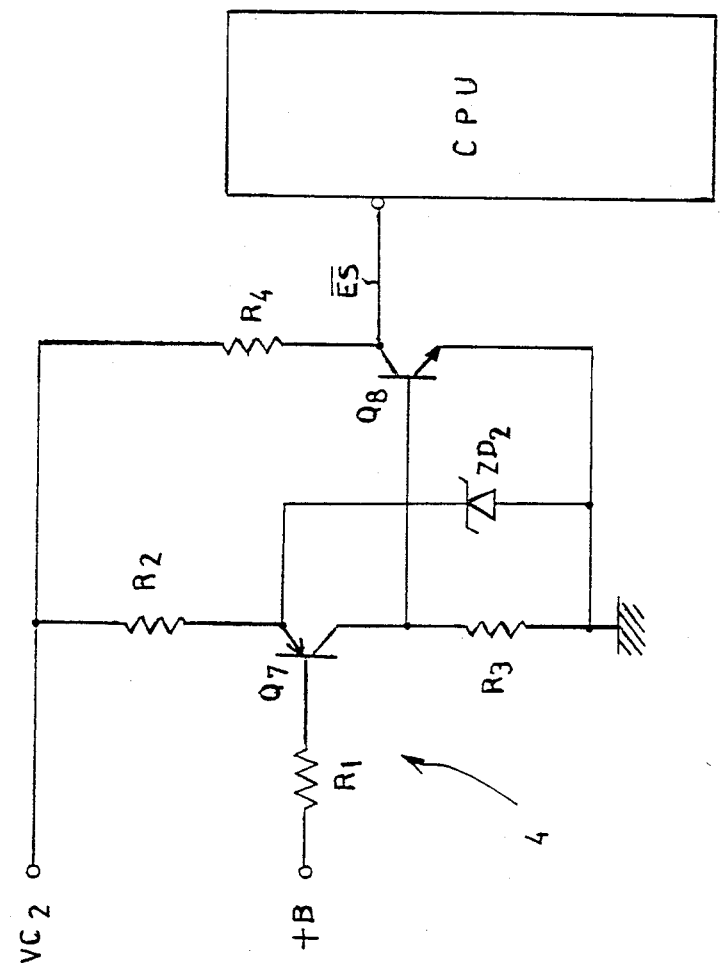
FIG. 3 is an electric circuit diagram depicting a voltage checking circuit used in the invention.

A voltage checking circuit 4, shown in FIG. 3, comprises transistors Q7 and Q8. The base of transistor Q7 is connected to terminal +B of memory backup power source 3, via a resistor R1, and the emitter of transistor Q7 is connected to second control power source VC2, via a resistor R2, and also to the cathode of a Zener diode ZD2, serving to set a reference voltage Vref (which will be described hereinbelow) witht the collector of transistor Q7 being grounded via resistor R3, and the anode of the Zener diode ZD2 being grounded. The base of transistor Q8 is connected to the collector of transistor Q7 and the collector of transistor Q8 is connected to second control power source VC2, via a resistor R4, and to central processing unit CPU, with the emitter of transistor Q8 being grounded. In case the voltage at terminal +B is below a reference voltage Vref, set by Zener diode ZD2, an error signal $\overline{ES}$ of a low level is produced from the collector of transistor Q8 and is fed to central processing unit CPU.

The elements disclosed in the FIGS. 1-3, are well known in the art, and may be purchased on the market, with descriptions thereof being contained in any reputable handbook.

The operation of the above embodiment described in FIGS. 1-3 will now be described below with reference to the signal waveforms shown in FIGS. 4(A)-4(H).

Upon interruption of power supply to the described apparatus, wherein memories are used, electric power is supplied from memory backup power supply source 3, to memories M1 . . . Ms so as to retain data in the memories. The switching of the backup power to the memories and power supply interruption which causes the triggering of such switching may be done by known citcuits, and are not shown herein for convenience and simplicity of description.

When power supply to the apparatus is resumed, central processing unit CPU is reset and kept disabled until the charge voltage of capacitor C1 reaches a predetermined voltage V2 and feeds a charge signal CHS of a high level to the base of transistor Q4, hence trurning "off" transistors Q5 and Q6. Consequently, second control power source VC2 is prevented from charging memory backup power source 3 while power supply signal PDWN is inverted to a high level, thereby preventing the occurence of data reading and data writing with regard to memories M1 . . . Mn.

After this foregoing operation, when the charge voltage of capacitor C1 reaches predetermined voltage V2, to invert reset signal $\overline{RES}$ to a high level, central processing unit CPU samples error signal $\overline{ES}$ obtained from voltage checking circuit 4. In case signal $\overline{ES}$ has a high level to indicate that voltage at terminal +B of memory backup power source 3 is above reference voltage Vref, which is sufficient for validly retaining the data stored in memories M1 . . . Mn, central processing unit CPU confirms valid retention of the data stored in memories M1 . . . Mn and inverts charge signal CHS to a low level.

Charging circuit 2 turns "on" transistors Q5 and Q6 in response to such a level change of charge signal CHS, so that memory backup power source 3, is charged by second control power source VC2, while power supply signal PDWN is inverted to a low level, thereby placing memories M1 . . . Mn in a state, ready for the process of data reading and data writing.

If the voltage at terminal +B of memory backup power source 3 is below reference voltage Vref, central processing unit CPU, receives error signal $\overline{ES}$ of a low level from voltage checking circuit 4 and decides that data stored in memories M1 . . . Mn, have been destroyed and are therefore invalid, and a buzzer, alarm lamp, or the like (not shown) may be energized and actuated in response to the error signal $\overline{ES}$.

Thus, according to the invention, charging circuit 2 is temporarily prevented from charging memory backup power source 3 upon resumption of power supply to the apparatus having the memory units, and simultaneously, voltage at terminal +B of memory backup power source 3 is compared with reference voltage Vref, which is sufficient for properly backing up memories M1 . . . Mn, so that it becomes possible to decide the validity of data stored in memories M1 . . . Mn.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. An electronic apparatus with memory backup system comprising
    memory means for storing data therein;
    memory backup power source being chargeable and capable of furnishing electric power to said memory means during interruption of power supply to said apparatus;
    charging circuit means for charging said memory backup power source after resumption of power supply to said apparatus;
    voltage checking means for checking the voltage of said memory backup power source and for generating a signal indicative of when said voltage of said memory backup power source is below or above a predetermined value; and
    control means comprising timing means for setting a period after resumption of power supply to said apparatus, inhibiting means for inhibiting said charging circuit means from charging said memory backup power source and for concurrently inhibiting data from being written into or being read out from said memory means during said period, and means for causing said voltage checking means to check the voltage of said memory backup power source during said period and responsive to said voltage of said memory backup power source being above said predetermined value to generate a signal confirming the valid retention of data stored in said memory means during said power supply interruption.

2. The apparatus of claim 1, wherein said memory backup power source comprises a chargeable battery.

3. The apparatus of claim 1, wherein said voltage checking means has a reference voltage of a predetermined value to be compared with the voltage of said memory backup power source.

4. The apparatus of claim 1, wherein said voltage checking means generates a signal permitting use of the contents of said memory means when said voltage of said memory backup power source is above said predetermined value.

* * * * *